(12) United States Patent
Lim et al.

(10) Patent No.: US 9,524,922 B2
(45) Date of Patent: Dec. 20, 2016

(54) INTEGRATED CIRCUIT HAVING MAIN ROUTE AND DETOUR ROUTE FOR SIGNAL TRANSMISSION AND INTEGRATED CIRCUIT PACKAGE INCLUDING THE SAME

(71) Applicant: Samsung Electronics Co., Ltd., Suwon-si, Gyeonggi-do (KR)

(72) Inventors: Kyounghwan Lim, Seoul (KR); Hyoun Soo Park, Seoul (KR); Kee Sup Kim, Hwaseong-si (KR); Bonghyun Lee, Suwon-si (KR); Chul Rim, Yongin-si (KR); JungYun Choi, Suwon-si (KR); Taewhan Kim, Seoul (KR); Heechun Park, Seoul (KR)

(73) Assignees: SAMSUNG ELECTRONICS CO., LTD., Gyeonggi-do (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/665,428

(22) Filed: Mar. 23, 2015

(65) Prior Publication Data

US 2015/0371926 A1    Dec. 24, 2015

(30) Foreign Application Priority Data

Jun. 19, 2014 (KR) .................. 10-2014-0075149

(51) Int. Cl.
*H01L 23/48* (2006.01)
*H03K 19/00* (2006.01)
(Continued)

(52) U.S. Cl.
CPC ............ *H01L 23/481* (2013.01); *H01L 22/14* (2013.01); *H01L 22/22* (2013.01); *H03K 19/00* (2013.01);
(Continued)

(58) Field of Classification Search
CPC ........ H01L 23/481; H01L 22/14; H01L 22/22; H01L 2924/0002; H01L 23/5226; H03K 19/00

See application file for complete search history.

(56) References Cited

U.S. PATENT DOCUMENTS 8,110,892 B2    2/2012    Lee et al.
8,384,417 B2    2/2013    Laisne et al.
(Continued)

OTHER PUBLICATIONS

Chiao-Ling Lung, et al., "Fault-Tolerant 3D Clock Network", DAC'11, Jun. 5-10, 2011, San Diego, California, Proceedings of the 48th Design Automation Conference, pp. 645-651.
(Continued)

*Primary Examiner* — Naum B Levin
(74) *Attorney, Agent, or Firm* — Harness, Dickey & Pierce, P.L.C.

(57) ABSTRACT

The integrated circuit includes first and second vias, a first buffer configured to receive a signal transmitted from the first via, a second buffer configured to receive a signal transmitted from the second via, a first detour circuit configured to receive a signal transmitted through the second buffer, a second detour circuit configured to receive a signal transmitted through the first buffer, a first selector configured to selectively output one of the signal transmitted from the first via and a signal transmitted through the first detour circuit, and a second selector configured to selectively output one of the signal transmitted from the second via and a signal transmitted through the second detour circuit. Each of the first and second buffers and the first and second detour circuits transmits a signal in only one direction.

20 Claims, 12 Drawing Sheets

(51) Int. Cl.
*H01L 21/66* (2006.01)
*H01L 23/522* (2006.01)

(52) U.S. Cl.
CPC .... *H01L 23/5226* (2013.01); *H01L 2924/0002* (2013.01)

(56) References Cited

U.S. PATENT DOCUMENTS

| | | | |
|---|---|---|---|
| 8,492,886 B2 | 7/2013 | Or-Bach et al. | |
| 8,522,096 B2 | 8/2013 | Wang et al. | |
| 8,531,199 B2* | 9/2013 | Wu | G01R 31/2853 324/762.01 |
| 8,654,593 B2 | 2/2014 | Oh et al. | |
| 8,704,226 B2* | 4/2014 | Morimoto | H01L 27/0688 257/48 |
| 8,736,296 B2 | 5/2014 | Chung et al. | |
| 8,754,704 B2* | 6/2014 | Huang | G01R 31/3187 327/565 |
| 9,177,940 B2* | 11/2015 | Lung | H01L 25/0657 |
| 2010/0060310 A1 | 3/2010 | Laisne et al. | |
| 2010/0332177 A1 | 12/2010 | Wu et al. | |
| 2011/0006391 A1 | 1/2011 | Lee et al. | |
| 2011/0248740 A1 | 10/2011 | Chung et al. | |
| 2011/0292742 A1 | 12/2011 | Oh et al. | |
| 2012/0110402 A1 | 5/2012 | Wang et al. | |
| 2012/0196390 A1 | 8/2012 | Or-Bach et al. | |
| 2012/0248438 A1 | 10/2012 | Lung et al. | |
| 2012/0319757 A1 | 12/2012 | Sato | |
| 2013/0076387 A1 | 3/2013 | Ishikawa et al. | |
| 2013/0214389 A1 | 8/2013 | Lee et al. | |
| 2014/0376364 A1* | 12/2014 | Franzon | G06F 11/2007 370/228 |
| 2015/0185274 A1* | 7/2015 | Hwang | G01R 31/318513 324/750.3 |

OTHER PUBLICATIONS

Ang-Chih Hsieh, et al., "TSV Redundancy: Architecture and Design Issues in 3-D IC", IEEE Transactions on Very Large Scale Integration (VLSI) Systems, vol. 20, No. 4, Apr. 2012, pp. 711-722.

Li Jiang, et al., "On Effective Through-Silicon Via Repair for 3-D-Stacked ICs", IEEE Transactions on Computer-Aided Design of Integrated Circuits and Systems vol. 32, No. 4, Apr. 2013, pp. 559-571.

Tak-Yung Kim, et al., "Clock Tree Synthesis with Pre-bond Testability for 3D Stacked IC Designs", Design Automation Conference (DAC), 2010 47th ACM/IEEE, DAC 2010, Jun. 13-18, 2010, Anaheim, California, pp. 723-728.

Igor Loi, et al., "A Low-overhead Fault Tolerance Scheme for TSV-based 3D Network on Chip Links", Computer-Aided Design, 2008. ICCAD 2008. IEEE/ACM International Conference on Nov. 10-13, 2008, pp. 5.

Uksong Kang et al., "8Gb 3D DDR3 DRAM Using Through-Silicon-Via Technology", 2009 IEEE International Solid-State Circuits Conference/Session 7/DRAM/7.2, pp. 130-132.

* cited by examiner

FIG. 5

| Case | CS1 | DS1 | CS2 | DS2 | Buffer Unit 1 | Buffer Unit 2 | Detour Unit 1 | Detour Unit 2 | OUT 1 | OUT 2 |
|---|---|---|---|---|---|---|---|---|---|---|
| Normal | 1 | 0 | 1 | 0 | On | On | Off | Off | From Via 1 | From Via 2 |
| Via 1 Disabled | 0 | 1 | 1 | 0 | Off | On | On | Off | Through Detour Unit 1 | From Via 2 |
| Via 2 Disabled | 1 | 0 | 0 | 1 | On | Off | Off | On | From Via 1 | Through Detour Unit 2 |

INTEGRATED CIRCUIT HAVING MAIN ROUTE AND DETOUR ROUTE FOR SIGNAL TRANSMISSION AND INTEGRATED CIRCUIT PACKAGE INCLUDING THE SAME

CROSS-REFERENCE TO RELATED APPLICATIONS

This U.S. non-provisional patent application claims priority under 35 U.S.C. §119 to Korean Patent Application No. 10-2014-0075149, filed on Jun. 19, 2014, the entire contents of which are incorporated herein by reference.

BACKGROUND

1. Field

The present disclosure relates to a configuration of an integrated circuit, and more particularly, to an integrated circuit including a detour route for a signal transmission and an integrated circuit package.

2. Description of the Related Art

An electronic device includes an integrated circuit. In order to reduce a size of a portable or mobile electronic device, a highly integrated circuit is used. As an integration technology is continuously developed, the portability of an electronic device is greatly improved.

An integrated circuit is produced in a package form. An integrated circuit package being produced recently includes a plurality of integrated circuit chips forming multiple layers. By stacking the plurality of integrated circuit chips, the degree of the integration may be improved. The plurality of integrated circuit chips forming multiple layers may perform more functions or store a large quantity of data compared with a single integrated circuit chip.

In order to transmit a signal between integrated circuit chips forming multiple layers, a signal transmission route is formed between the integrated circuit chips. In order to form a signal transmission route between the integrated circuit chips, a technology such as a 'wire bonding' was used. Recently, in order to transmit a signal between the integrated circuit chips, a through-silicon via (TSV) having a structure of penetrating each of the plurality of integrated circuit chips is being used.

A signal is transmitted between integrated circuit chips through the TSV. However, if any TSV is faulty, the TSV may not transmit a signal. Thus, a method for coping with a situation that a faulty TSV exists is needed.

SUMMARY

An example embodiment of the present disclosure may provide an integrated circuit. The integrated circuit may include first and second vias which are configured to penetrate a plurality of chips and to provide a signal transmission route between the chips, a first buffer connected between an output terminal of the first via and a detour node and configured to receive a signal transmitted from the first via, a second buffer connected between an output terminal of the second via and the detour node and configured to receive a signal transmitted from the second via, a first detour circuit configured to receive a signal transmitted through the second buffer, a second detour circuit configured to receive a signal transmitted through the first buffer, a first selector configured to selectively output one of the signal transmitted from the first via and a signal transmitted through the first detour circuit based on a state of signal transmission through the first via, and a second selector configured to selectively output one of the signal transmitted from the second via and a signal transmitted through the second detour circuit based on a state of signal transmission through the second via. Each of the first and second buffers and the first and second detour circuits is configured to transmit a signal in only one direction.

An example embodiment of the present disclosure may provide an integrated circuit package. The integrated circuit package may include a plurality of chips, at least two vias configured to penetrate at least one of the plurality of chips and to provide a signal transmission route between the plurality of chips, and a detour circuit configured to provide a detour route for first and second vias among at least two vias. The detour circuit may include a first buffer connected between an output terminal of the first via and a detour node and configured to receive a signal transmitted from the first via, a second buffer connected between an output terminal of the second via and the detour node and configured to receive a signal transmitted from the second via, a first detour circuit configured to receive a signal transmitted through the second buffer, a second detour circuit configured to receive a signal transmitted through the first buffer, a first selector configured to selectively output one of the signal transmitted from the first via and a signal transmitted through the first detour circuit based on a state of signal transmission through the first via, and a second selector configured to selectively output one of the signal transmitted from the second via and a signal transmitted through the second detour circuit based on a state of signal transmission through the second via. Each of the first and second buffers and the first and second detour circuits is configured to transmit a signal in only one direction.

An example embodiment of the present disclosure may provide an integrated circuit configured to provide a detour route between a first through-silicon via (TSV) and a second TSV. The integrated circuit may include a first switch circuit connected between an output terminal of the first TSV and a detour node included in the detour route and configured to receive a first signal transmitted from the first TSV, a second switch circuit connected between an output terminal of the second TSV and the detour node and configured to receive a second signal transmitted from the second TSV, a third switch circuit configured to receive the second signal transmitted through the second switch circuit and the detour node, a fourth switch circuit configured to receive the first signal transmitted through the first switch circuit and the detour node, a first multiplexer configured to selectively output one of the first signal transmitted from the first TSV and the second signal transmitted through the third switch circuit in response to a first determination associated with whether the first TSV is normal or disabled, and a second multiplexer configured to selectively output one of the second signal transmitted from the second TSV and the first signal transmitted through the fourth switch circuit in response to a second determination associated with whether the second TSV is normal or disabled. Each of the first and fourth switch circuits is configured to transmit the first signal in only one direction, and each of the second and third switch circuits is configured to transmit the second signal in only one direction.

BRIEF DESCRIPTION OF THE DRAWINGS

The above and other aspects, features, and advantages of certain embodiments of the present disclosure will become apparent from the following detailed description with reference to the following figures, wherein like reference numerals refer to like parts throughout the various figures unless otherwise specified.

FIG. 5 is a table explaining operations of an integrated circuit illustrated in FIG. 4.

DETAILED DESCRIPTION OF EMBODIMENTS

Figure 1:
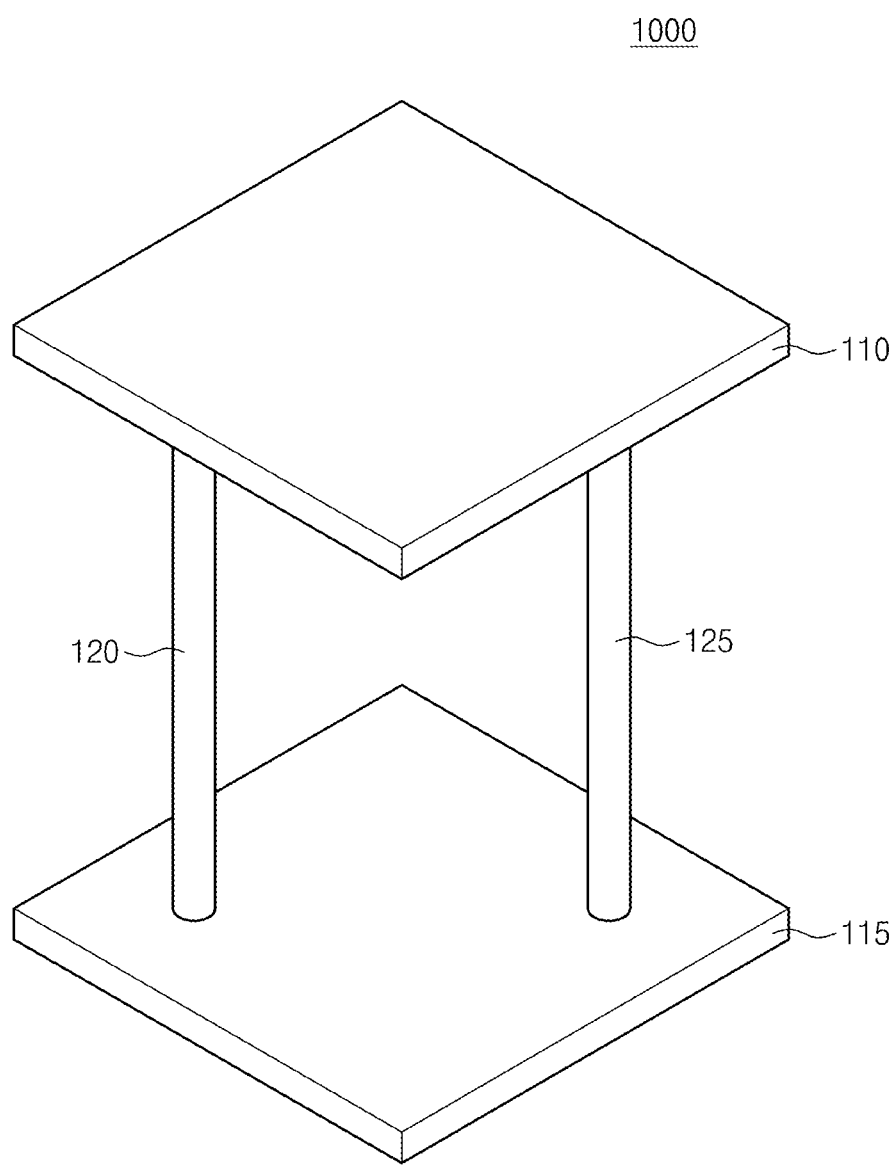
FIG. 1 is a schematic diagram illustrating a connection between two chips through two vias.

Example embodiments of the present disclosure will be described more fully hereinafter with reference to the accompanying drawings, in which example embodiments of the present disclosure are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the size and relative sizes of elements may be exaggerated for clarity. Like numbers refer to like elements throughout.

FIG. 1 is a schematic diagram illustrating a connection between two chips through two vias. A first chip 110 and a second chip 115 may be included in an integrated circuit package 1000. The first chip 110 and the second chip 115 may include one or more electric (or electronic) circuits. The integrated circuit package 1000 may include three or more chips. The two chips 110 and 115 are illustrated in FIG. 1, but the number of chips included the integrated circuit package 1000 may be variously changed or modified.

A first via 120 and a second via 125 may connect the first chip 110 and the second chip 115. The first via 120 and the second via 125 may provide signal transmission routes between the first chip 110 and the second chip 115. The first chip 110 and the second chip 115 may transmit a signal to each other through at least one of the first via 120 and the second via 125. Each of the first via 120 and the second via 125 may be configured to penetrate the first chip 110 and the second chip 115. As an embodiment, each of the first via 120 and the second via 125 may be a through-silicon via (TSV). Two vias 120 and 125 are illustrated in FIG. 1, but the number of vias to provide signal transmission routes between multiple chips may be variously changed or modified.

Figure 2:
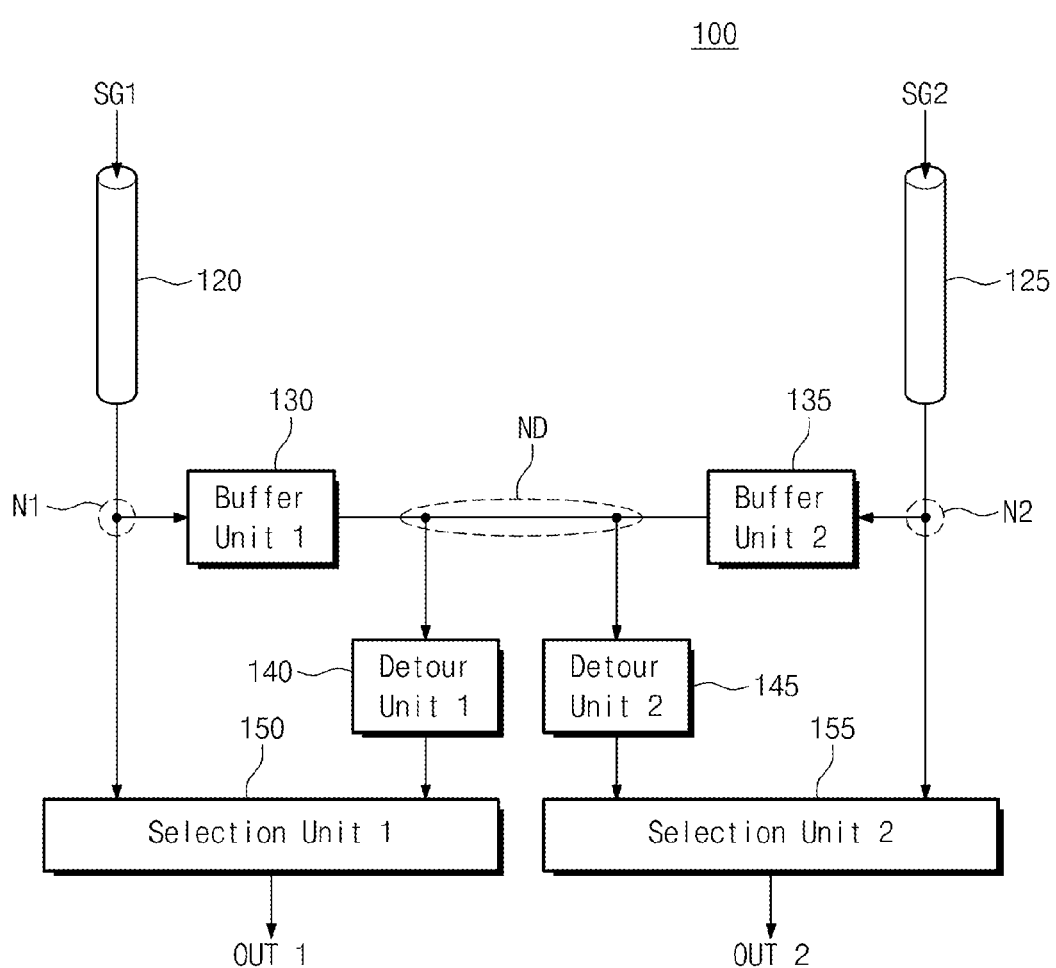
FIGS. 2 to 4 are block diagrams illustrating configurations of an integrated circuit according to an example embodiment of the present disclosure.

FIG. 2 is a block diagram illustrating a configuration of an integrated circuit according to an example embodiment of the present disclosure. An integrated circuit 100 may include a first via 120 and a second via 125. The integrated circuit 100 may further include a first buffer unit 130, a second buffer unit 135, a first detour unit 140, a second detour unit 145, a first selection unit 150, and a second selection unit 155.

As mentioned with reference to FIG. 1, each of the first via 120 and the second via 125 may provide a signal transmission route between multiple chips. The first via 120 may receive a first signal SG1 from a chip. The second via 125 may receive a second signal SG2 from a chip.

The first buffer unit 130 may be connected between an output terminal N1 of the first via 120 and a detour node ND. The first buffer unit 130 may receive the first signal SG1 transmitted from the first via 120. The first buffer unit may transmit the received first signal SG1 to the second detour unit 145. The first buffer unit 130 may be implemented by one or more electric (or electronic) circuits. For instance, the first buffer unit 130 may be implemented by at least one of a switch element or circuit, a transmission gate, a metal oxide silicon field effect transistor (MOSFET), a fuse circuit, and so on. That is, the first buffer unit 130 may be implemented to transmit a signal.

The second buffer unit 135 may be connected between an output terminal N2 of the second via 125 and the detour node ND. The second buffer unit 135 may receive the second signal SG2 transmitted from the second via 125. The second buffer unit may transmit the received second signal SG2 to the first detour unit 140. The second buffer unit 135 may be implemented by one or more electric (or electronic) circuits. For instance, the second buffer unit 135 may be implemented by at least one of a switch element or circuit, a transmission gate, a MOSFET, a fuse circuit, and so on. That is, the second buffer unit 135 may be implemented to transmit a signal.

The detour node ND is a node included in a 'detour route'. The detour route may be used to transmit a signal when signal transmission through the first via 120 and the second via 125 is disabled. The signal transmission may be disabled due to various causes (e.g., a faulty via, a disabled wire, a broken pad, and so on). Signal transmission through the detour route will be more described later.

The first detour unit 140 may be connected to the detour node ND. The first detour unit 140 may receive the second signal SG2 transmitted through the second buffer unit 135. The first detour unit 140 may transmit the received second signal SG2 to the first selection unit 150. The first detour unit 140 may be implemented by one or more electric (or electronic) circuits. For instance, the first detour unit 140 may be implemented by at least one of a switch element or circuit, a transmission gate, a MOSFET, a fuse circuit, and so on. That is, the first detour unit 140 may be implemented to transmit a signal.

The second detour unit 145 may be connected to the detour node ND. The second detour unit 145 may receive the first signal SG1 transmitted through the first buffer unit 130. The second detour unit 145 may transmit the received first signal SG1 to the second selection unit 155. The second detour unit 145 may be implemented by one or more electric (or electronic) circuits. For instance, the second detour unit 145 may be implemented by at least one of a switch element or circuit, a transmission gate, a MOSFET, a fuse circuit, and so on. That is, the second detour unit 145 may be implemented to transmit a signal.

The first selection unit 150 may selectively output one of the first signal SG1 transmitted from the first via 120 and the second signal SG2 transmitted through the first detour unit 140. In particular, when the signal transmission through the first via 120 is normal, the first selection unit 150 may select and output the first signal SG1 transmitted from the first via 120 as a first output signal OUT 1. On the other hand, when the signal transmission through the first via 120 is disabled, the first selection unit 150 may select and output the second signal SG2 transmitted through the second buffer unit 135 and the first detour unit 140 as the first output signal OUT 1. The first selection unit 150 may output the first output signal OUT 1 based on a state of the signal transmission through the first via 120.

As an embodiment, when the signal transmission through the first via 120 is normal, the first detour unit 140 may be inactivated, and thereby the first selection unit 150 may receive the first signal SG1. As an embodiment, when the signal transmission through the first via 120 is disabled, the second buffer unit 135 and the first detour unit 140 may be activated, and the first buffer unit 130 and the second detour unit 145 may be inactivated, and thereby the first selection unit 150 may receive the second signal SG2 instead of the first signal SG1. The first selection unit 150 may be implemented by one or more electric (or electronic) circuits, such as logic circuits. For instance, the first selection unit 150 may be implemented by a multiplexer to selectively output one of multiple signals.

The second selection unit 155 may selectively output one of the second signal SG2 transmitted from the second via 125 and the first signal SG1 transmitted through the second detour unit 145. In particular, when signal transmission through the second via 125 is normal, the second selection unit 155 may select and output the second signal SG2 transmitted from the second via 125 as a second output signal OUT 2. On the other hand, when signal transmission through the second via 125 is disabled, the second selection unit 155 may select and output the first signal SG1 transmitted through the first buffer unit 130 and the second detour unit 145 as the second output signal OUT 2. The second selection unit 155 may output the second output signal OUT 2 based on a state of the signal transmission through the second via 125.

As an embodiment, when the signal transmission through the second via 125 is normal, the second detour unit 145 may be inactivated, and thereby the second selection unit 155 may receive the second signal SG2. As an embodiment, when the signal transmission through the second via 125 is disabled, the first buffer unit 130 and the second detour unit 145 may be activated, and the second buffer unit 135 and the first detour unit 140 may be inactivated, and thereby the second selection unit 155 may receive the first signal SG1 instead of the second signal SG2. The second selection unit 155 may be implemented by one or more electric (or electronic) circuits, such as logic circuits. For instance, the second selection unit 155 may be implemented by a multiplexer to selectively output one of multiple signals.

In an example embodiment of the present disclosure, each of the first buffer unit 130, the second buffer unit 135, the first detour unit 140, and the second detour unit 145 may transmit a signal in only one direction. In particular, a signal being transmitted through each of the first buffer unit 130, the second buffer unit 135, the first detour unit 140, and the second detour unit 145 may be transmitted in the direction indicated by an arrow illustrated in FIG. 2. According to the above embodiment, each of the first buffer unit 130, the second buffer unit 135, the first detour unit 140, and the second detour unit 145 may further include a circuit for preventing a slew rate characteristic of a signal transmitted through the detour route from being deteriorated. Accordingly, the form of the signal transmitted through the detour route may be prevented from being distorted, and the detour route of an example embodiment of the present disclosure may be connected between two vias which are spaced a long distance apart from each other. This embodiment will be more described with reference to FIG. 7.

Figure 3:
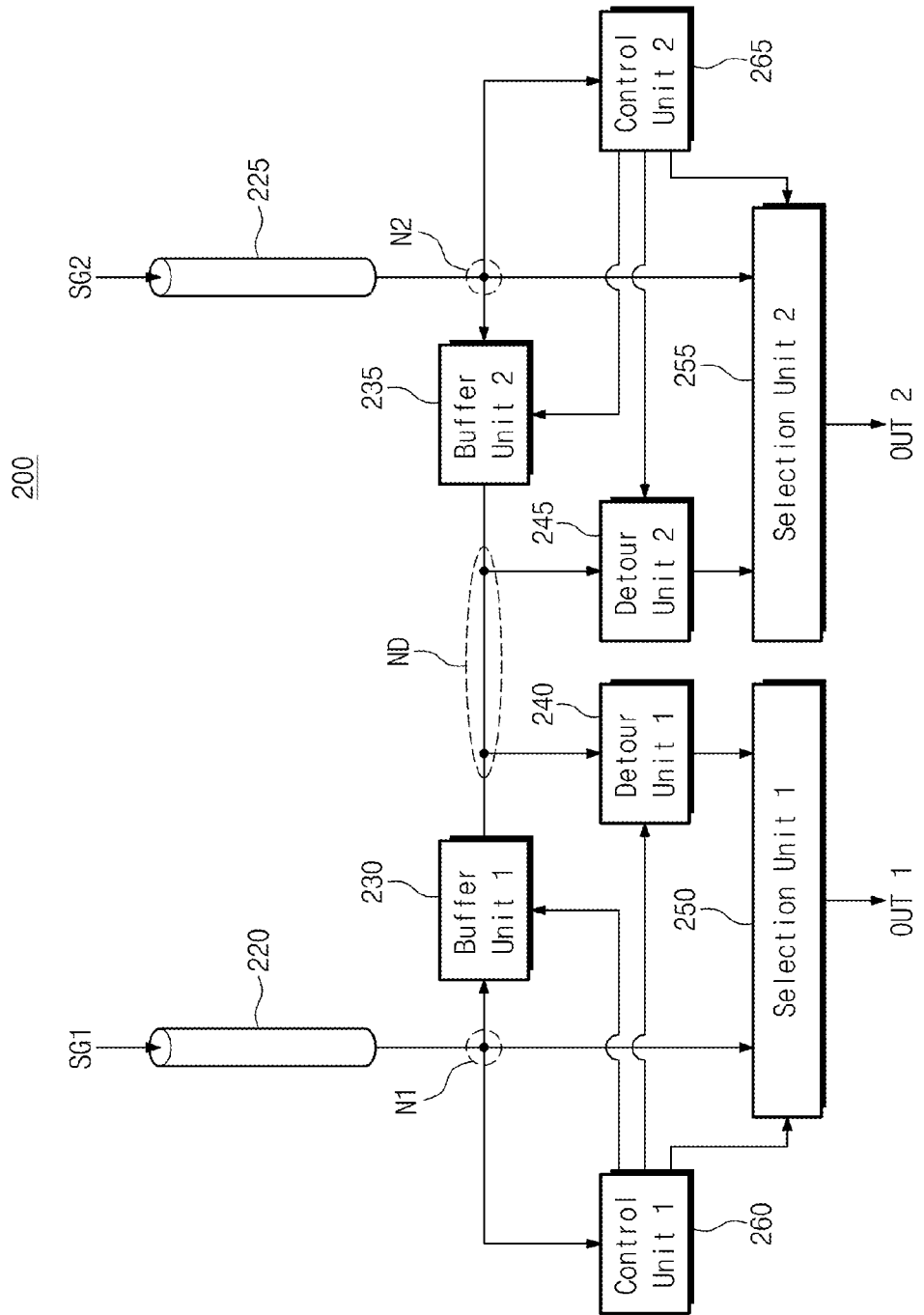

FIG. 3 is a block diagram illustrating a configuration of an integrated circuit according to an example embodiment of the present disclosure. An integrated circuit 200 may include a first via 220 and a second via 225. The integrated circuit 200 may further include a first buffer unit 230, a second buffer unit 235, a first detour unit 240, a second detour unit 245, a first selection unit 250, a second selection unit 255, a first control unit 260, and a second control unit 265. Functions and configurations of the first via 220, the second via 225, the first buffer unit 230, the second buffer unit 235, the first detour unit 240, the second detour unit 245, the first selection unit 250, and the second selection unit 255 may include functions and configurations of the first via 120, the second via 125, the first buffer unit 130, the second buffer unit 135, the first detour unit 140, the second detour unit 145, the first selection unit 150, and the second selection unit 155 of FIG. 2, respectively. Thus, redundant descriptions associated with the first via 220, the second via 225, the first buffer unit 230, the second buffer unit 235, the first detour unit 240, the second detour unit 245, the first selection unit 250, and the second selection unit 255 will be omitted below.

The first control unit 260 may control operations of the first buffer unit 230, the first detour unit 240, and the first selection unit 250. The first control unit 260 may control signal transmission through the first buffer unit 230 by turning the first buffer unit 230 on or off. The first control unit 260 may control signal transmission through the first detour unit 240 by turning the first detour unit 240 on or off. The first control unit 260 may control the first selection unit 250 such that one of a first signal SG1 transmitted from the first via 220 and a second signal SG2 transmitted through the first detour unit 240 can be selectively outputted from the first selection unit 250.

Further, the first control unit 260 may determine whether signal transmission through the first via 220 is normal or disabled. To achieve this, the first control unit 260 may be connected to an output terminal N1 of the first via 220. As an embodiment, the first control unit 260 may detect whether a voltage level of the output terminal N1 of the first via 220 is changed. The first control unit 260 may control operations of the first buffer unit 230, the first detour unit 240, and the first selection unit 250 based on whether the signal transmission through the first via 220 is normal or disabled.

The second control unit 265 may control operations of the second buffer unit 235, the second detour unit 245, and the second selection unit 255. The second control unit 265 may control signal transmission through the second buffer unit 235 by turning the second buffer unit 235 on or off. The second control unit 265 may control signal transmission through the second detour unit 245 by turning the second detour unit 245 on or off. The second control unit 265 may control the second selection unit 255 such that one of a second signal SG2 transmitted from the second via 225 and a first signal SG1 transmitted through the second detour unit 245 can be selectively outputted from the second selection unit 255.

Further, the second control unit 265 may determine whether signal transmission through the second via 225 is normal or disabled. To achieve this, the second control unit 265 may be connected to an output terminal N2 of the second via 225. As an embodiment, the second control unit 265 may detect whether a voltage level of the output terminal N2 of the second via 225 is changed. The second control unit 265 may control operations of the second buffer unit 235, the second detour unit 245, and the second selection unit 255 based on whether the signal transmission through the second via 225 is normal or disabled.

Each of the first control unit 260 and the second control unit 265 may be implemented by one or more electric (or electronic) circuits. For instance, each of the first control unit 260 and the second control unit 265 may be implemented by one or more analog circuits, one or more logic circuits, or a combination thereof.

Figure 4:
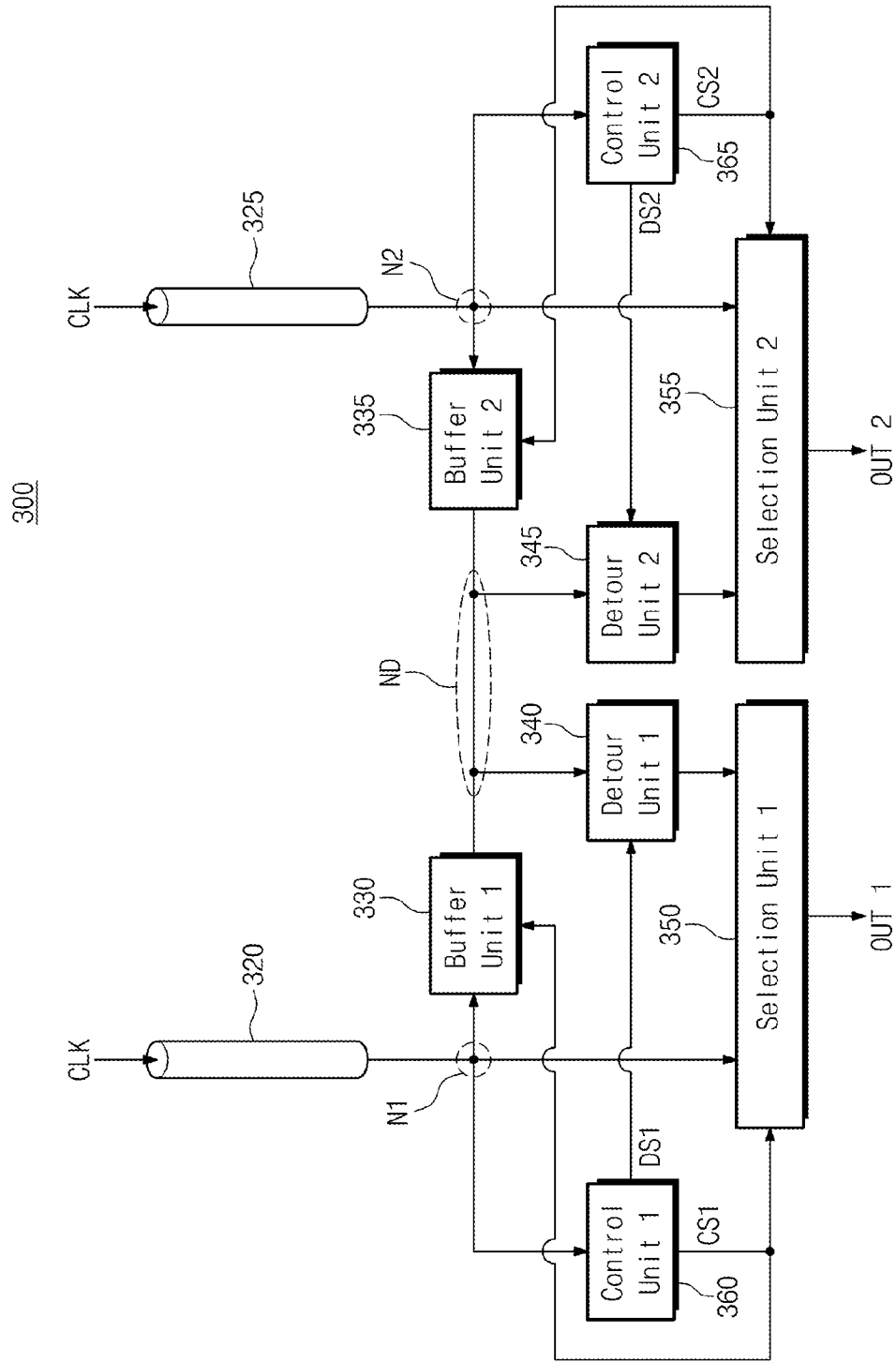

FIG. 4 is a block diagram illustrating a configuration of an integrated circuit according to an example embodiment of the present disclosure. FIG. 5 is a table explaining operations of an integrated circuit illustrated in FIG. 4.

An integrated circuit 300 may include a first via 320 and a second via 325. The integrated circuit 300 may further include a first buffer unit 330, a second buffer unit 335, a first detour unit 340, a second detour unit 345, a first selection unit 350, a second selection unit 355, a first control unit 360, and a second control unit 365. Functions and configurations of the first via 320, the second via 325, the first buffer unit 330, the second buffer unit 335, the first detour unit 340, the second detour unit 345, the first selection unit 350, the second selection unit 355, the first control unit 360, and the second control unit 365 may include functions and configurations of the first via 220, the second via 225, the first buffer unit 230, the second buffer unit 235, the first detour unit 240, the second detour unit 245, the first selection unit 250, the second selection unit 255, the first control unit 260, and the second control unit 265 of FIG. 3, respectively. Thus, redundant descriptions associated with the first via 320, the second via 325, the first buffer unit 330, the second buffer unit 335, the first detour unit 340, the second detour unit 345, the first selection unit 350, the second selection unit 355, the first control unit 360, and the second control unit 365 will be omitted below.

It is assumed that the first via 320 and the second via 325 receive the same clock signal CLK with reference to FIGS. 4 and 5. However, this assumption intends to help understanding of the present disclosure, and the present disclosure is not limited thereto.

The first control unit 360 may determine whether transmission of the clock signal CLK through the first via 320 is normal or disabled. As an embodiment, the first control unit 360 may generate a first control signal CS1 and a first detour signal DS1 based on a determination result. In this embodiment, the first buffer unit 330 and the first selection unit 350 may be controlled by the first control signal CS1, and the first detour unit 340 may be controlled by the first detour signal DS1. As an embodiment, a logical value of the first control signal CS1 and a logical value of the first detour signal DS1 may be complementary to each other.

The second control unit 365 may determine whether transmission of the clock signal CLK through the second via 325 is normal or disabled. As an embodiment, the second control unit 365 may generate a second control signal CS2 and a second detour signal DS2 based on a determination result. In this embodiment, the second buffer unit 335 and the second selection unit 355 may be controlled by the second control signal CS2, and the second detour unit 345 may be controlled by the second detour signal DS2. As an embodiment, a logical value of the second control signal CS2 and a logical value of the second detour signal DS2 may be complementary to each other. Here, in order to describe operations of the integrated circuit 300, FIG. 5 is referred together with FIG. 4.

First, a case that both of the first via 320 and the second via 325 normally transmit the clock signal CLK is described. When transmission of the clock signal CLK through the first via 320 is normal, the first control unit 360 may generate the first control signal CS1 having a value of logic "1" and the first detour signal DS1 having a value of logic "0". When the transmission of the clock signal CLK through the second via 325 is normal, the second control unit 365 may generate the second control signal CS2 having a value of logic "1" and the second detour signal DS2 having a value of logic "0". Based on the generated signals, the first buffer unit 330 and the second buffer unit 335 may be turned on, and the first detour unit 340 and the second detour unit 345 may be turned off.

Since the first detour unit 340 is turned off and the transmission of the clock signal CLK through the first via 320 is normal, the first selection unit 350 may select and output the clock signal CLK transmitted from the first via 320 as a first output signal OUT 1 based on the first control signal CS1. Since the second detour unit 345 is turned off and the transmission of the clock signal CLK through the second via 325 is normal, the second selection unit 355 may select and output the clock signal CLK transmitted from the second via 325 as a second output signal OUT 2 based on the second control signal CS2. Accordingly, each of the first selection unit 350 and the second selection unit 355 may normally output the clock signal CLK.

Second, a case that the first via 320 is disabled, while the second via 325 normally transmits the clock signal CLK, is described. When the transmission of the clock signal CLK through the first via 320 is disabled, the first control unit 360 may generate the first control signal CS1 having a value of logic "0" and the first detour signal DS1 having a value of logic "1". When the transmission of the clock signal CLK through the second via 325 is normal, the second control unit 365 may generate the second control signal CS2 having a value of logic "1" and the second detour signal DS2 having a value of logic "0". Based on the generated signals, the first buffer unit 330 and the second detour unit 345 may be turned off, and the second buffer unit 335 and the first detour unit 340 may be turned on. In this case, the second buffer unit 335 may transmit the clock signal CLK transmitted from the second via 325 to the first detour unit 340. Thus, a detour route including the second buffer unit 335 and the first detour unit 340 may be provided.

Since the detour route including the second buffer unit 335 and the first detour unit 340 is provided and the transmission of the clock signal CLK through the first via 320 is disabled, the first detour unit 340 may transmit the clock signal CLK transmitted through the second buffer unit 335 to the first selection unit 350. Further, the first selection unit 350 may select and output the clock signal CLK transmitted through the first detour unit 340 as the first output signal OUT 1 based on the first control signal CS1. On the other hand, since the second detour unit 345 is turned off and the transmission of the clock signal CLK through the second via 325 is normal, the second selection unit 355 may select and output the clock signal CLK transmitted from the second via 325 as the second output signal OUT 2 based on the second control signal CS2. Accordingly, each of the first selection unit 350 and the second selection unit 355 may normally output the clock signal CLK.

Third, a case that the second via 325 is disabled, while the first via 320 normally transmits the clock signal CLK, is described. When the transmission of the clock signal CLK through the first via 320 is normal, the first control unit 360 may generate the first control signal CS1 having a value of logic "1" and the first detour signal DS1 having a value of logic "0". When the transmission of the clock signal CLK through the second via 325 is disabled, the second control unit 365 may generate the second control signal CS2 having a value of logic "0" and the second detour signal DS2 having a value of logic "1". Based on the generated signals, the first buffer unit 330 and the second detour unit 345 may be turned on, and the second buffer unit 335 and the first detour unit 340 may be turned off. In this case, the first buffer unit 330 may transmit the clock signal CLK transmitted from the first via 320 to the second detour unit 345. Thus, a detour route including the first buffer unit 330 and the second detour unit 345 may be provided.

Since the first detour unit 340 is turned off and the transmission of the clock signal CLK through the first via 320 is normal, the first selection unit 350 may select and output the clock signal CLK transmitted from the first via 320 as the first output signal OUT 1 based on the first control signal CS1. On the other hand, since the detour route including the first buffer unit 330 and the second detour unit 345 is provided and the transmission of the clock signal CLK through the second via 325 is disabled, the second detour unit 345 may transmit the clock signal CLK transmitted through the first buffer unit 330 to the second selection unit 355. Further, the second selection unit 355 may select and output the clock signal CLK transmitted through the second detour unit 345 as the second output signal OUT 2 based on the second control signal CS2. Accordingly, each of the first selection unit 350 and the second selection unit 355 may normally output the clock signal CLK.

The integrated circuit according to an example embodiment of the present disclosure may be further connected between the first via 320 and another via (hereinafter, it is referred to as a 'third via'), which is not illustrated in FIG. 4. Further, the integrated circuit according to an example embodiment of the present disclosure may also be connected between the second via 325 and the third via. When both of the transmission of the clock signal CLK through the first via 320 and the transmission of the clock signal CLK through the second via 325 are disabled, a clock signal transmitted from the third via may be transmitted to the first selection unit 350 and the second selection unit 355 through detour routes. Thus, regardless of a state of the signal transmission through the first via 320 and the second via 325, each of the first selection unit 350 and the second selection unit 355 may normally output the clock signal CLK.

However, the configurations and the operations of the integrated circuit 300 described with reference to FIGS. 4 and 5 are only an example embodiment to implement the present disclosure. Configurations and operations of the integrated circuit according to the present disclosure may be variously changed or modified. The present disclosure is not limited to the configurations and the operations described with reference to FIGS. 4 and 5.

Figure 6:
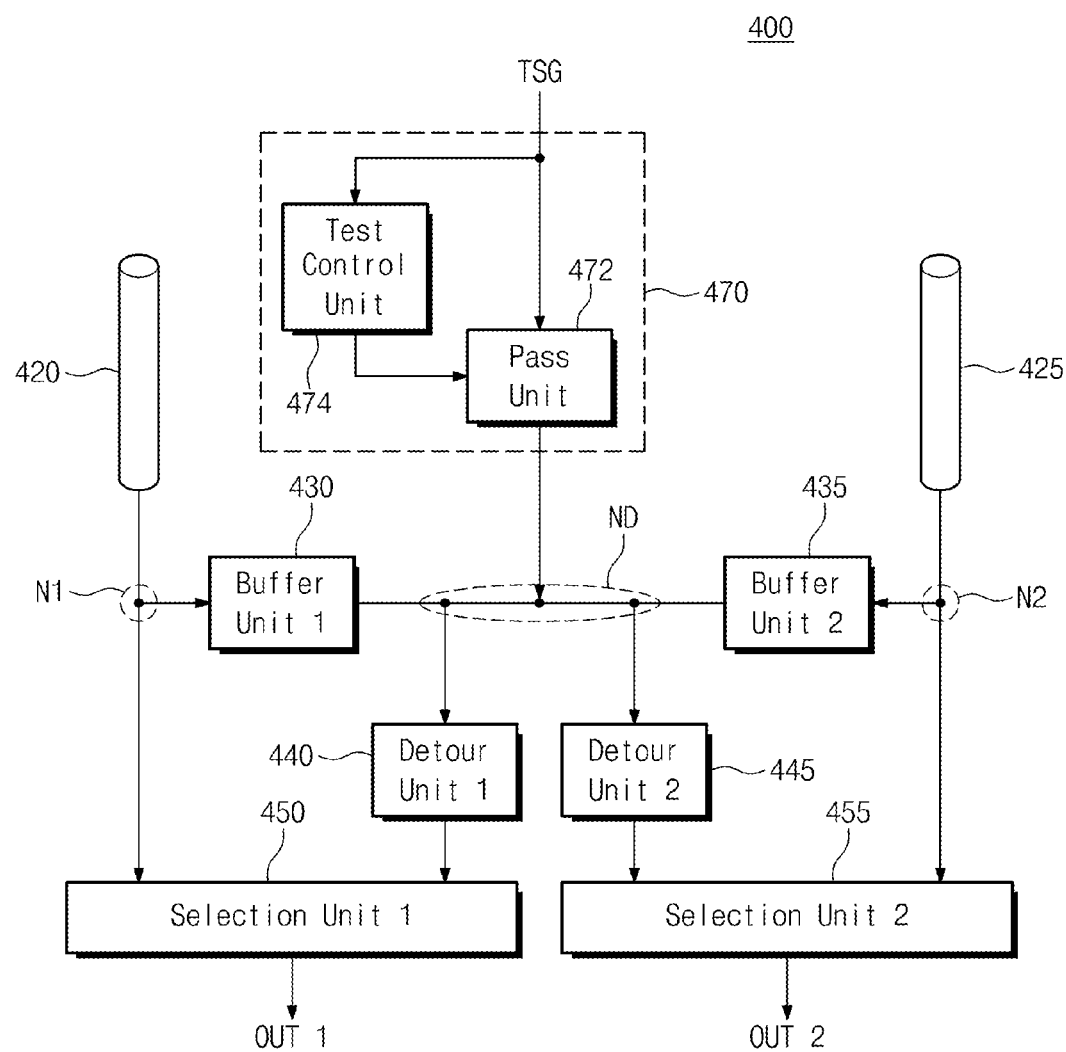
FIG. 6 is a block diagram illustrating a configuration of an integrated circuit according to an example embodiment of the present disclosure.

FIG. 6 is a block diagram illustrating a configuration of an integrated circuit according to an example embodiment of the present disclosure. An integrated circuit 400 may include a first via 420 and a second via 425. The integrated circuit 400 may further include a first buffer unit 430, a second buffer unit 435, a first detour unit 440, a second detour unit 445, a first selection unit 450, a second selection unit 455, and a test unit 470. Functions and configurations of the first via 420, the second via 425, the first buffer unit 430, the second buffer unit 435, the first detour unit 440, the second detour unit 445, the first selection unit 450, and the second selection unit 455 may include functions and configurations of the first via 120, the second via 125, the first buffer unit 130, the second buffer unit 135, the first detour unit 140, the second detour unit 145, the first selection unit 150, and the second selection unit 155 of FIG. 2, respectively. Thus, redundant descriptions associated with the first via 420, the second via 425, the first buffer unit 430, the second buffer unit 435, the first detour unit 440, the second detour unit 445, the first selection unit 450, and the second selection unit 455 will be omitted below.

The test unit 470 may be used in a pre-bond test. That is, the test unit 470 may be used to test a state of signal transmission on a chip of a lower layer, at a test mode before stacking a plurality of chips connected through the first via 420 and the second via 425. At the test mode, the test unit 470 may receive a test signal TSG. The test unit 470 may transmit the received test signal TSG to a detour node ND.

At the test mode, the test signal TSG transmitted to the detour node ND may be transmitted to each of the first detour unit 440 and the second detour unit 445. At the test mode, the first detour unit 440 and the second detour unit 445 may be controlled to be turned on. The first selection unit 450 may receive the test signal TSG transmitted through the first detour unit 440. The first selection unit 450 may output the received test signal TSG as a first output signal OUT 1. The second selection unit 455 may receive the test signal TSG transmitted through the second detour unit 445. The second selection unit 455 may output the received test signal TSG as a second output signal OUT 2.

The test unit 470 may be implemented by one or more electric (or electronic) circuits. For instance, the test unit 470 may be implemented by one or more analog circuits, one or more logic circuits, or a combination thereof. The test unit 470 may include a pass unit 472 and a test control unit 474.

The pass unit 472 may be connected between an input terminal of the test signal TSG and the detour node ND. The pass unit 472 may receive the test signal TSG and may transmit the received test signal TSG to the detour node ND. The pass unit 472 may be implemented by one or more electric (or electronic) circuits. For instance, the pass unit 472 may be implemented by at least one of a switch element of circuit, a transmission gate, a MOSFET, a fuse circuit, and so on. That is, the pass unit 472 may be implemented to transmit a signal.

The test control unit 474 may control transmission of the test signal TSG through the pass unit 472. As an embodiment, when the test signal TSG is normally inputted, the test control unit 474 may control the pass unit 472 such that the pass unit 472 can be turned on. When the pass unit 472 is turned on, the test signal TSG may be transmitted to the detour node ND through the pass unit 472. The test control unit 474 may be implemented by one or more electric (or electronic) circuits. For instance, the test control unit 474 may be implemented by one or more analog circuits, one or more logic circuits, or a combination thereof.

Figure 7:
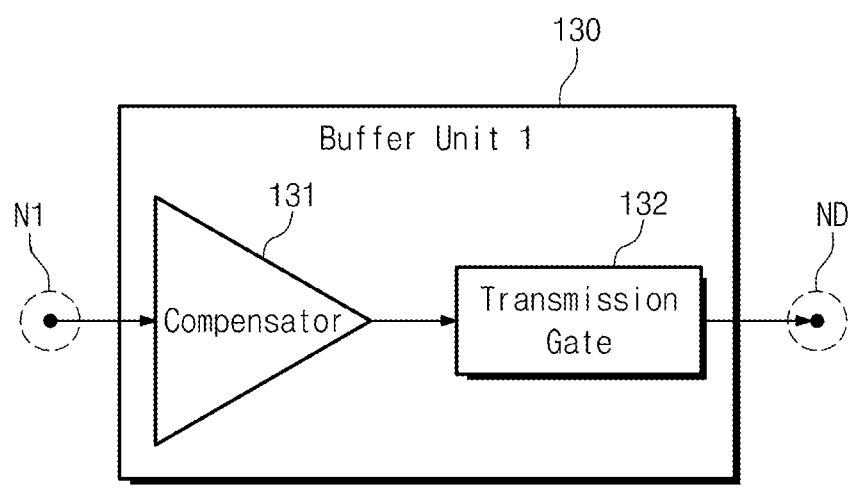
FIG. 7 is a block diagram illustrating a configuration of a buffer unit or a detour unit illustrated in FIG. 2.

FIG. 7 is a block diagram illustrating a configuration of a buffer unit or a detour unit illustrated in FIG. 2. As an embodiment, a first buffer unit 130 of FIG. 2 may include a compensator 131 and a transmission gate 132.

For instance, when signal transmission through the second via 125 (refer to FIG. 2) is disabled, the first buffer unit 130 may be included in a detour route for transmitting the first signal SG1 (refer to FIG. 2) to the second selection unit 155 (refer to FIG. 2). However, a length of a route for transmitting the first signal SG1 when the second selection unit 155 receives the first signal SG1 through the first buffer unit 130 and the second detour unit 145 (refer to FIG. 2) may be longer than a length of a route for transmitting the second signal SG2 (refer to FIG. 2) when the second selection unit 155 receives the second signal SG2 from the second via 125. While the first signal SG1 is being transmitted to the second selection unit 155 through the first buffer unit 130 and the second detour unit 145, the first signal SG1 may be distorted. Due to resistance and/or capacitance of a signal transmission route, a slew rate characteristic of the first signal SG1 may be degraded.

The compensator 131 may be connected to an output terminal N1 of the first via (refer to FIG. 2) in order to receive the first signal SG1. The compensator 131 may compensate a distortion of the first signal SG1 transmitted to the second detour unit 145 through the first buffer unit 130. As an embodiment, the compensator 131 may include a driving circuit or element (e.g., one or more transistors) for increasing driving power of current corresponding to the first signal SG1. In this embodiment, when the driving power of the current corresponding to the first signal SG1 increases, degradation of the slew rate characteristic of the first signal SG1 may be prevented. Thus, while the first signal SG1 is being transmitted to the second selection unit 155 through the second detour unit 145, the distortion of the first signal SG1 may be minimized.

The transmission gate 132 may transmit the first signal SG1 compensated by the compensator 131 to the detour node ND. As an embodiment, the transmission gate 132 may be controlled by the first control unit 260 (refer to FIG. 3). However, the transmission gate 132 may be replaced with another device, element, or circuit (e.g., a switch, a MOS-FET, a fuse circuit, and so on) for signal transmission.

As described above, the first buffer unit 130 may transmit a signal in only one direction. For instance, the first buffer unit 130 may transmit the signal in only one direction which is directed from the output terminal N1 of the first via 120 to the detour node ND. If the first buffer unit 130 is configured to transmit the signal bilaterally, it is difficult to include the compensator 131 in the first buffer unit 130. In an example embodiment of the present disclosure, the first buffer unit 130 may be configured to transmit the signal in only one direction, and thereby the compensator 131 for compensating a distortion of the signal may be used. The integrated circuit 100 (refer to FIG. 2) may have a configuration that properly transmits the signal while including the first buffer unit 130 for transmitting the signal in only one direction.

Until now, with reference to FIG. 7, the first buffer unit 130 is mentioned. However, each of the second buffer unit 135 (refer to FIG. 2), the first detour unit 140 (refer to FIG. 2), and the second detour unit 145 may also be configured to include the compensator 131. By using the compensator 131, a distortion of a signal being transmitted through a detour route may be compensated. That is, according to an example embodiment of the present disclosure, a slew rate characteristic of the signal transmitted through the detour route may be prevented from being degraded. When a distortion of the signal is compensated, the detour route of an example embodiment of the present disclosure may be connected between two vias spaced a long distance apart from each other. Further, when a circuit including the detour route according to an example embodiment of the present disclosure is used, it is not necessary to add a redundant via for performing a function of a faulty or disabled via. Thus, the integrated circuit according to an example embodiment of the present disclosure may include a few numbers of vias.

Figure 8:
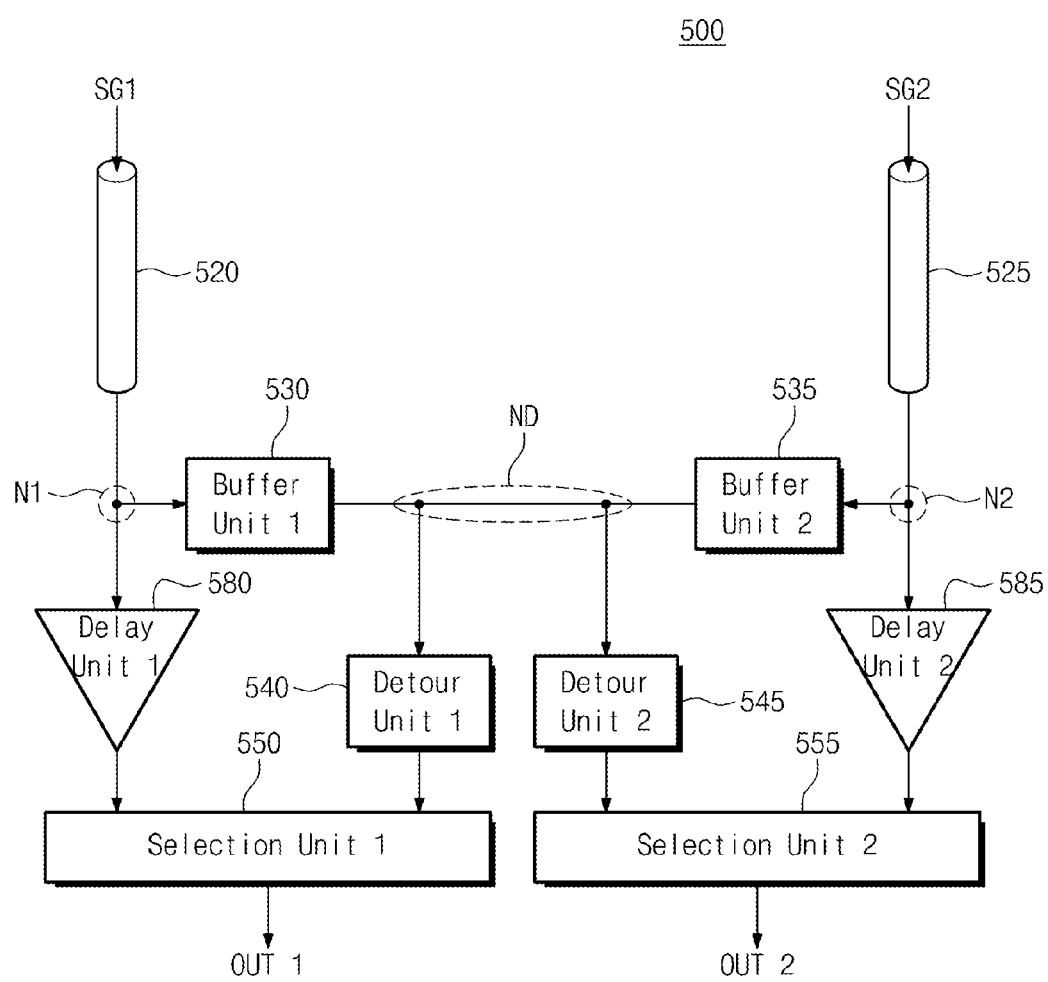
FIG. 8 is a block diagram illustrating a configuration of an integrated circuit according to an example embodiment of the present disclosure.

FIG. 8 is a block diagram illustrating a configuration of an integrated circuit according to an example embodiment of the present disclosure. An integrated circuit 500 may include a first via 520 and a second via 525. The integrated circuit 500 may further include a first buffer unit 530, a second buffer unit 535, a first detour unit 540, a second detour unit 545, a first selection unit 550, a second selection unit 555, a first delay unit 580, and a second delay unit 585. Functions and configurations of the first via 520, the second via 525, the first buffer unit 530, the second buffer unit 535, the first detour unit 540, the second detour unit 545, the first selection unit 550, and the second selection unit 555 may include functions and configurations of the first via 120, the second via 125, the first buffer unit 130, the second buffer unit 135, the first detour unit 140, the second detour unit 145, the first selection unit 150, and the second selection unit 155 of FIG. 2, respectively. Thus, redundant descriptions associated with the first via 520, the second via 525, the first buffer unit 530, the second buffer unit 535, the first detour unit 540, the second detour unit 545, the first selection unit 550, and the second selection unit 555 will be omitted below.

The first delay unit 580 may be connected to an output terminal N1 of the first via 520. The first delay unit 580 may receive a first signal SG1 from the first via 520. The first delay unit 580 may delay the first signal SG1 transmitted from the first via 520. The first delay unit 580 may transmit the delayed first signal SG1 to the first selection unit 550.

The second delay unit 585 may be connected to an output terminal N2 of the second via 525. The second delay unit 585 may receive a second signal SG2 from the second via 525. The second delay unit 585 may delay the second signal SG2 transmitted from the second via 525. The second delay unit 585 may transmit the delayed second signal SG2 to the second selection unit 555.

Each of the first delay unit 580 and the second delay unit 585 may be implemented by one or more electric (or electronic) circuits. For instance, each of the first delay unit 580 and the second delay unit 585 may be implemented by one or more analog circuits, one or more logic circuits, or a combination thereof. For instance, each of the first delay unit 580 and the second delay unit 585 may include at least one of a relay circuit, a flip-flop, a shift register, and so on.

For instance, when signal transmission through the first via 520 is normal while signal transmission through the second via 525 is disabled, the second selection unit 555 may receive the first signal SG1 through a detour route including the first buffer unit 530 and the second detour unit 545, and the first selection unit 550 may receive the first signal SG1 from the first via 520. In this instance, a length of the detour route including the first buffer unit 530 and the second detour unit 545 may be longer than a length between the output terminal N1 of the first via 520 and the first selection unit 550. Thus, the time taken for the first signal SG1 to reach the second selection unit 555 may be longer than the time taken for the first signal SG1 to reach the first selection unit 550. In particular, when the first signal SG1 is a clock signal and the time taken for the first signal SG1 to reach the first selection unit 550 is different from the time taken for the first signal SG1 to reach the second selection unit 555, an edge of the clock signal outputted from the first selection unit 550 and an edge of the clock signal outputted from the second selection unit 555 may be skewed.

To make the time taken for the first signal SG1 to reach the first selection unit 550 to be equal to the time taken for the first signal SG1 to reach the second selection unit 555, the first delay unit 580 may delay the first signal SG1 transmitted from the first via 520. The first delay unit 580 may transmit the delayed first signal SG1 to the first selection unit 550. The second delay unit 585 may be used for the same purpose as the first delay unit 580, thus, redundant descriptions are omitted.

Figure 9:
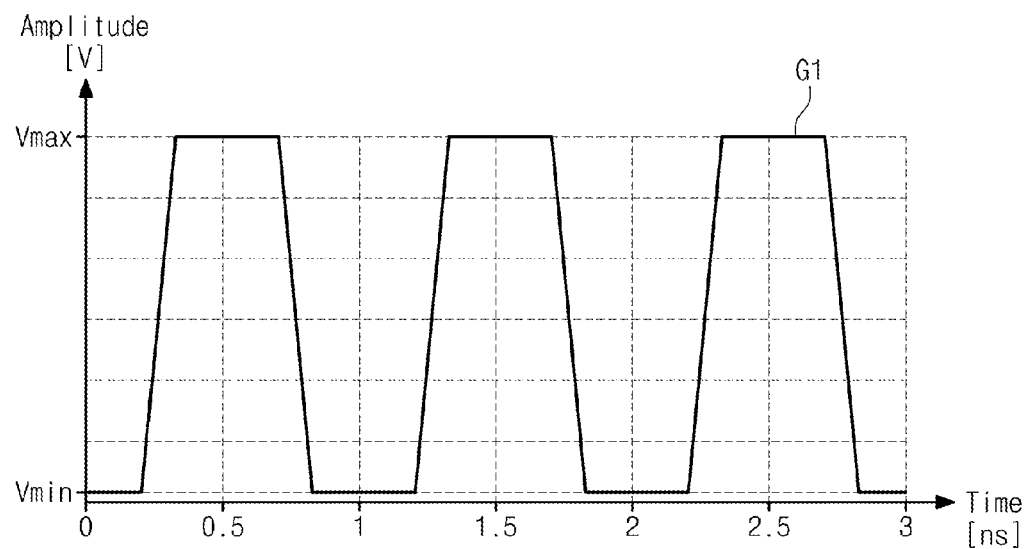
FIG. 9 is a graph illustrating a form of a signal inputted to a via of an example embodiment of the present disclosure.
Figure 10:
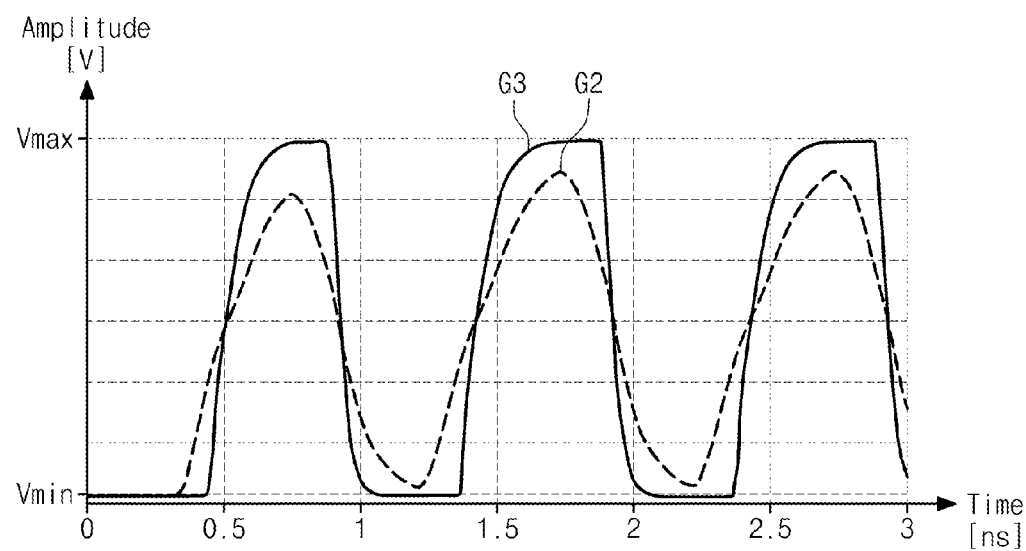
FIG. 10 is a graph showing an effect obtained by using an example embodiment of the present disclosure.

FIG. 9 is a graph illustrating a form of a signal inputted to a via of an example embodiment of the present disclosure. FIG. 10 is a graph showing an effect obtained by using an example embodiment of the present disclosure.

As an embodiment, each of the first signal SG1 (refer to FIG. 2) inputted to the first via 120 (refer to FIG. 2) and the second signal SG2 (refer to FIG. 2) inputted to the second via 125 (refer to FIG. 2) may be a clock signal. In this embodiment, each of the first signal SG1 and the second signal SG2 may have a form like a graph G1 of FIG. 9. With respect to each of the first signal SG1 and the second signal SG2, logic "1" corresponding to a maximum voltage Vmax and logic "0" corresponding to a minimum voltage Vmin may periodically appear.

A broken line G2 and a solid line G3 are shown in FIG. 10. The broken line G2 shows a form of an output signal OUT 1 or OUT 2 (refer to FIG. 2) outputted when a clock signal is transmitted without using the present disclosure. Comparing the graph G1 of FIG. 9 to the broken graph G2 of FIG. 10, it is understood that an edge of the broken line G2 of FIG. 10 does not clearly appear. Without using the present disclosure, a transmitted clock signal may be severely distorted.

The solid line G3 shows a form of an output signal OUT 1 or OUT 2 outputted when a clock signal is transmitted through a detour route according to an example embodiment of the present disclosure. As described above, a signal may be transmitted in only one direction through the detour route in accordance with an example embodiment of the present disclosure. Thus, the compensator 131 (refer to FIG. 7) for compensating a distortion of the signal may be used. Comparing the graph G1 of FIG. 9 to the solid graph G3 of FIG. 10, it is understood that an edge of the solid graph G3 of FIG. 10 clearly appears, even though the solid graph G3 of FIG. 10 is a little different from an original clock signal G1. Thus, when the detour route in accordance with an example embodiment of the present disclosure is used, the clock signal may be properly transmitted without a severe distortion. In particular, when the detour route in accordance with an example embodiment of the present disclosure is connected between two vias spaced a long distance apart from each other, an effect obtained by the present disclosure becomes much clear.

Figure 11:
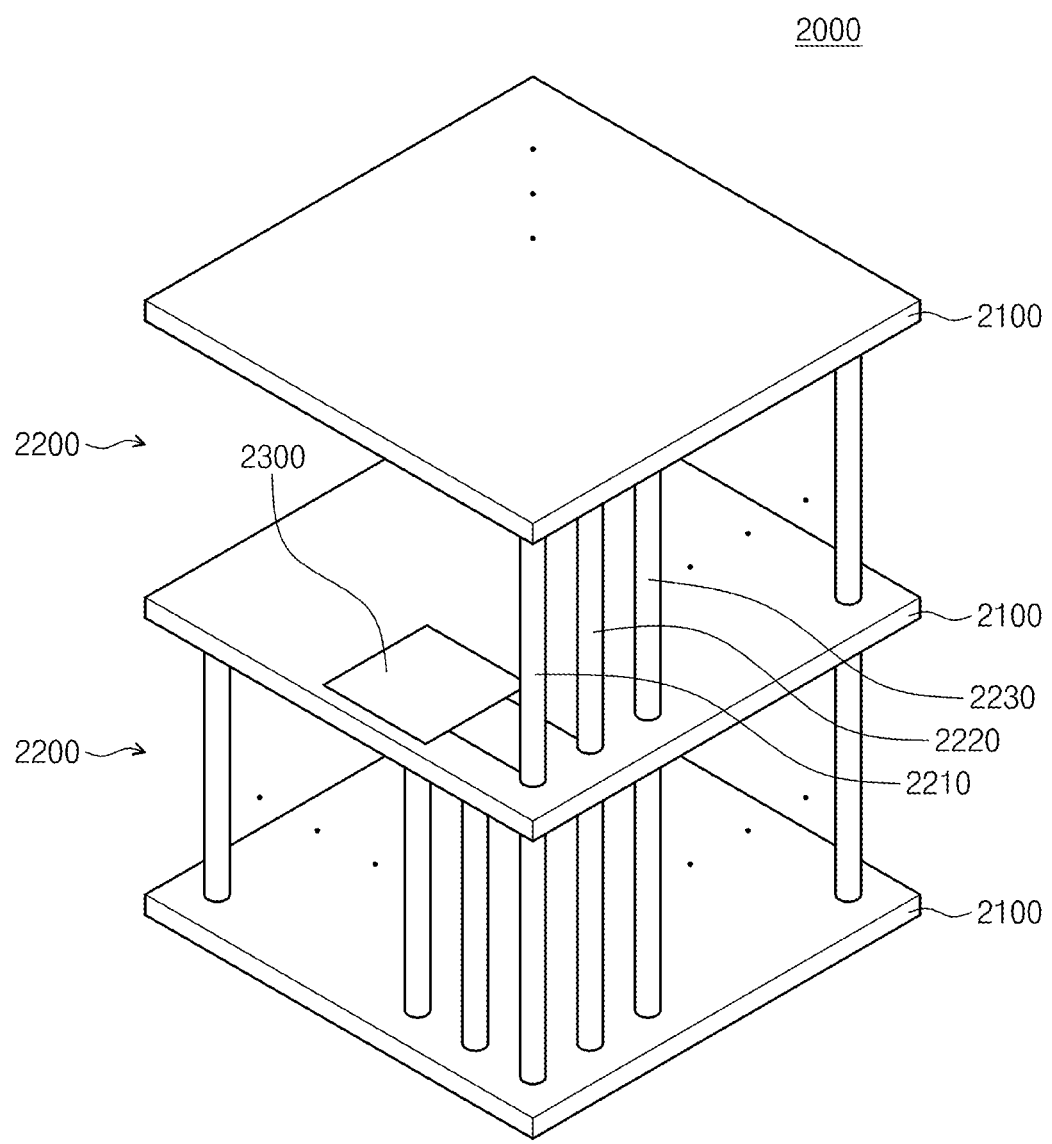
FIG. 11 is a schematic diagram illustrating a configuration of an integrated circuit package according to an example embodiment of the present disclosure.

FIG. 11 is a schematic diagram illustrating a configuration of an integrated circuit package according to an example embodiment of the present disclosure. An integrated circuit package 2000 may include a plurality of chips 2100, a plurality of vias 2200, and a detour circuit 2300.

Each of the plurality of chips 2100 may form a layer. FIG. 11 shows that the integrated circuit package 2000 includes three chips 2100, but the present disclosure is not limited thereto. The number of the plurality of chips 2100 and an arrangement of the plurality of chips 2100 may be variously changed or modified.

The plurality of vias 2200 may connect each of the plurality of chips 2100 to one another. Each of the plurality of vias 2200 may provide a signal transmission route between the plurality of chips 2100. Each of the plurality of chips 2100 may transmit a signal to one another through at least one of the plurality of vias 2200. Each of the plurality of vias 2200 may be configured to penetrate at least one of the plurality of chips 2100. As an embodiment, each of the plurality of vias 2200 may be a through-silicon via. The plurality of vias 2200 may include at least two vias. However, the number of the plurality of vias 2200 and an arrangement of the plurality of vias 2200 may be variously changed or modified.

The detour circuit 2300 may provide a detour route for a first via 2210 and a second via 2220 based on an example embodiment of the present disclosure. The detour circuit 2300 may be implemented based on at least one of example embodiments described with reference to FIGS. 1 to 8. As an embodiment, the detour circuit 2300 may include a first buffer unit, a second buffer unit, a first detour unit, a second detour unit, a first selection unit, and a second selection unit.

The first buffer unit may be connected between an output terminal of the first via 2210 and a detour node. The first buffer unit may receive a signal transmitted from the first via 2210. The second buffer unit may be connected between an output terminal of the second via 2220 and the detour node. The second buffer unit may receive a signal transmitted from the second via 2220. The first detour unit may receive a signal transmitted through the second buffer unit. The second detour unit may receive a signal transmitted through the first buffer unit.

The first selection unit may selectively output one of the signal transmitted from the first via 2210 and a signal transmitted through the first detour unit, based on a state of signal transmission through the first via 2210. For instance, when the signal transmission through the first via 2210 is disabled, the signal transmitted from the second via 2220 may be provided to the first selection unit through the second buffer unit and the first detour unit. The first selection unit may output the signal transmitted through the first detour unit. The second selection unit may selectively output one of the signal transmitted from the second via 2220 and a signal transmitted through the second detour unit, based on a state of signal transmission through the second via 2220. In particular, each of the first buffer unit, the second buffer unit, the first detour unit, and the second detour unit may transmit a signal in only one direction. Example embodiments associated with the detour circuit 2300 is described with reference to FIGS. 1 to 8, thus, redundant descriptions are omitted.

FIG. 11 shows that the detour circuit 2300 is connected between the first via 2210 and the second via 2220. However, as necessary, the detour circuit 2300 may be connected between any one pair of vias. For instance, the detour circuit 2300 may be connected between the first via 2210 and the third via 2230. For instance, the detour circuit 2300 may be connected between the second via 2220 and the third via 2230. As necessary, the detour circuit 2300 may be connected between all pairs of vias. FIG. 11 intends to help understanding of the present disclosure. The present disclosure is not limited to configurations of the integrated circuit 2000 illustrated in FIG. 11.

Figure 12:
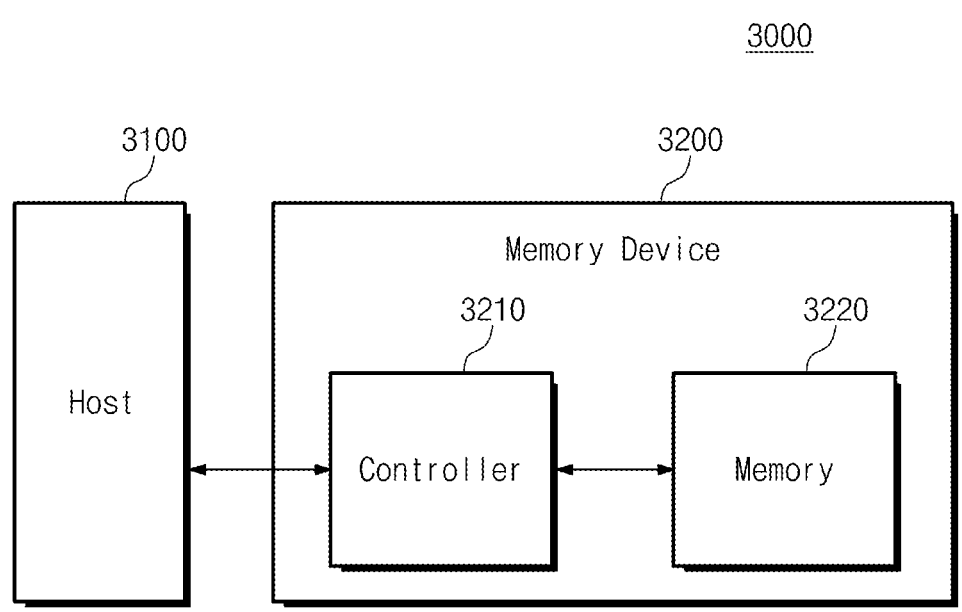
FIG. 12 is a block diagram illustrating a configuration of a memory system implemented based on an example embodiment of the present disclosure.

FIG. 12 is a block diagram illustrating a configuration of a memory system implemented based on an example embodiment of the present disclosure. A memory system may include a host 3100 and a memory device 3200. The memory device 3200 may include a controller 3210 and a memory 3220.

The host 3100 may provide a command for controlling the memory device 3200 to the controller 3210. The host 3100 may store data in the memory device or read data stored in the memory device 3200. As an embodiment, the host 3100 may be an electronic device such as a computer, a digital camera, a portable phone, etc. The host 300 may communicate with the memory device 3200 according to at least one of various interface protocols such as a universal serial bus (USB), a small computer small interface (SCSI), a peripheral component interconnection express (PCIe), a nonvolatile memory express (NVMe), an advanced technology attachment (ATA), a parallel ATA (PATA), a serial ATA (SATA), an integrated drive electronics (IDE), a multimedia card (MMC), an enhanced small disk interface (ESDI), a universal flash storage (UFS), and so on.

The controller 3210 may control an overall operation of the memory device 3200. The memory 3220 may store or output data under the control of the controller 3210. As an embodiment, the memory 3220 may include a nonvolatile memory such as a flash memory, a phase-change random access memory (PRAM), a magneto-resistive RAM (MRAM), a resistive RAM (ReRAM), a ferroelectric RAM (FRAM), and so on, or a volatile memory such as a static RAM (SRAM), a dynamic RAM (DRAM), a synchronous DRAM (SDRAM), and so on. As necessary, the memory device 3200 may include different kinds of memories.

At least one of the controller 3210 and the memory 3220 of the memory device 3200 may be implemented based on the present disclosure. As an embodiment, an integrated circuit included in each of the controller 3210 and the memory 3220 may include a detour circuit in accordance with the present disclosure.

Figure 13:
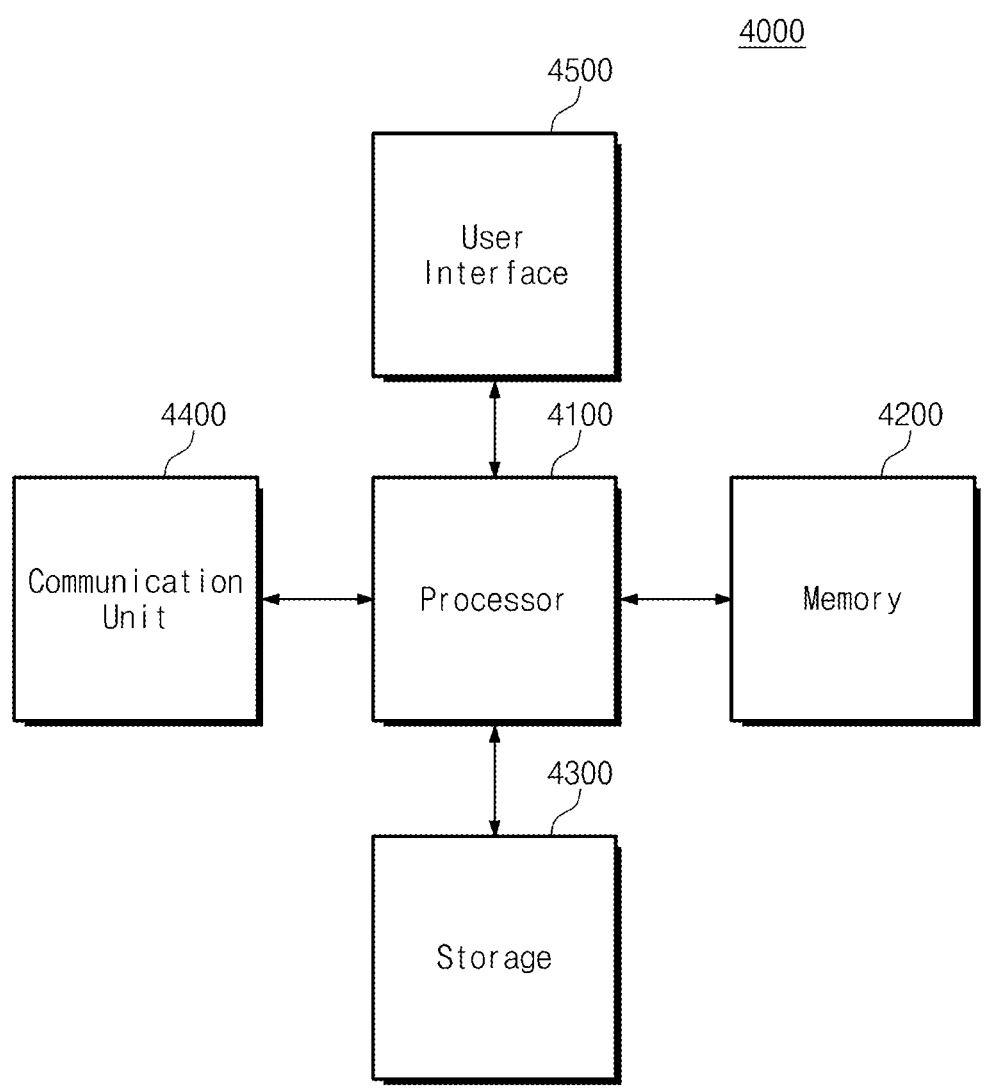
FIG. 13 is a block diagram illustrating a configuration of an electronic device implemented based on an example embodiment of the present disclosure.

FIG. 13 is a block diagram illustrating a configuration of an electronic device implemented based on an example embodiment of the present disclosure. The electronic device 4000 may include a processor 4100, a memory 4200, storage 4300, a communication unit 4400, and a user interface 4500.

The processor 4100 may control an overall operation of the electronic device 4000. The processor 4100 may perform various kinds of arithmetic and/or logical operations. As an embodiment, the processor 4100 may be a general purpose processor used in a computer or a workstation. As an embodiment, the processor 4100 may be implemented by a system on chip (SoC). For instance, the processor 4100 may be an application processor used in a mobile device such as a portable phone.

The memory 4200 may exchange data with the processor 4100. The memory 4200 may be a main memory of the processor 4100 or the electronic device 4000. The memory 4200 may include a volatile memory such as an SRAM, a DRAM, an SDRAM, and so on, or a nonvolatile memory such as a flash memory, a PRAM, an MRAM, an ReRAM, an FRAM, and so on. The memory 4200 may include at least one memory module or at least one memory package.

The storage 4300 may store data to be stored for a long time. The storage 4300 may be a flash memory such as a solid state drive (SSD) and an embedded MMC (eMMC), or a nonvolatile memory such as a PRAM, an MRAM, an ReRAM, an FRAM, and so on. As necessary, the memory 4200 or the storage 4300 may include different kinds of memories.

The communication unit 4400 may communicate with the external system or device of the electronic device 4000 under the control of the processor 4100. The communication unit 4400 may communicate according to a wired or wireless communication protocol. As an embodiment, the communication unit 4400 may communicate according to at least one of various wireless communication protocols such as a long term evolution (LTE), a world interoperability for microwave access (WiMax), a global system for mobile communication (GSM), a code division multiple access (CDMA), a Bluetooth, a near field communication (NFC), a WiFi, a radio frequency identification (RFID), and so on, or at least one of various wired communication protocols such as a USB, an SCSI, a PCIe, an ATA, a PATA, an SATA, an SAS, a Firewire, and so on.

The user interface 4500 may relay a communication between a user and the electronic device 4000 under the control of the processor 4100. As an embodiment, the user interface 4500 may include input interfaces such as a keyboard, a keypad, a button, a touch panel, a touch screen, a touch pad, a touch ball, a camera, a microphone, a gyroscope sensor, a vibration sensor, and so on. Further, the user interface 4500 may include output interfaces such as a liquid crystal display (LCD), an organic light emitting diode (OLED) display, an active matrix OLED (AMOLED) display, a light emitting diode (LED), a speaker, a motor, and so on.

At least one of the processor 4100, the memory 4200, the storage 4300, the communication unit 4400, and the user interface 4500 may be implemented based on the present disclosure. As an embodiment, an integrated circuit included in each of the processor 4100, the memory 4200, the storage 4300, the communication unit 4400, and the user interface 4500 may include a detour circuit in accordance with the present disclosure.

A configuration illustrated in each conceptual diagram should be understood just from a conceptual point of view. Shape, structure, and size of each component illustrated in each conceptual diagram are exaggerated or downsized for understanding of the present disclosure. An actually implemented configuration may have a physical shape different from a configuration of each conceptual diagram. The present disclosure is not limited to a physical shape or size illustrated in each conceptual diagram.

A device configuration illustrated in each block diagram is to help understanding of the present disclosure. Each block may be formed of smaller blocks according to a function. Alternatively, a plurality of blocks may form a larger block according to a function. That is, the present disclosure is not limited to components illustrated in each block diagram.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An integrated circuit comprising:
   first and second vias, each of the first and second vias being configured to penetrate a plurality of chips and configured to provide a signal transmission route between the plurality of chips;
   a first buffer connected between an output terminal of the first via and a detour node, and configured to receive a signal transmitted from the first via;
   a second buffer connected between an output terminal of the second via and the detour node, and configured to receive a signal transmitted from the second via;

a first detour circuit configured to receive a signal transmitted through the second buffer;
a second detour circuit configured to receive a signal transmitted through the first buffer, an output of the first buffer, an output of the second buffer, an input of the first detour circuit, and an input of the second detour circuit being connected with the detour node together;
a first selector configured to selectively output one of the signal transmitted from the first via and a signal transmitted through the first detour circuit, based on a state of signal transmission through the first via; and
a second selector configured to selectively output one of the signal transmitted from the second via and a signal transmitted through the second detour circuit, based on a state of signal transmission through the second via,
wherein each of the first and second buffers and the first and second detour circuits is configured to transmit a signal in only one direction.

2. The integrated circuit of claim 1, wherein when the signal transmission through the first via is disabled, the signal transmitted from the second via is provided to the first selector through the second buffer and the first detour circuit.

3. The integrated circuit of claim 2, wherein the first selector is configured to output the signal transmitted through the first detour circuit.

4. The integrated circuit of claim 1, further comprising:
a first controller configured to control operations of the first buffer, the first detour circuit, and the first selector; and
a second controller configured to control operations of the second buffer, the second detour circuit, and the second selector.

5. The integrated circuit of claim 4, wherein the first controller is configured to determine whether the signal transmission through the first via is normal or disabled, and the second controller is configured to determine whether the signal transmission through the second via is normal or disabled.

6. The integrated circuit of claim 4, wherein when the signal transmission through the second via is disabled:
the first buffer is configured to be turned on according to a control of the first controller, and configured to transmit the signal transmitted from the first via to the second detour circuit, and
the second detour circuit is configured to be turned on according to a control of the second controller, and configured to transmit the signal transmitted through the first buffer to the second selector.

7. The integrated circuit of claim 6, wherein the second selector is configured to output the signal transmitted through the second detour circuit according to the control of the second controller.

8. The integrated circuit of claim 1, further comprising a test circuit configured to receive a test signal at a test mode, and configured to transmit the received test signal to the detour node.

9. The integrated circuit of claim 8, wherein the test circuit comprises:
a pass circuit configured to receive the test signal and configured to transmit the received test signal to the detour node; and
a test controller configured to control the pass circuit.

10. The integrated circuit of claim 8, wherein at the test mode, the test signal transmitted to the detour node is transmitted to each of the first and second detour circuits.

11. The integrated circuit of claim 10, wherein at the test mode, the first selector is configured to output the test signal transmitted through the first detour circuit, and the second selector is configured to output the test signal transmitted through the second detour circuit.

12. The integrated circuit of claim 1, wherein at least one of the first and second buffers and the first and second detour circuits comprises a compensator configured to compensate a distortion of a transmitted signal.

13. The integrated circuit of claim 1, further comprising:
a first delay circuit configured to delay the signal transmitted from the first via, configured to generate a first delayed signal, and configured to transmit the first delayed signal to the first selector; and
a second delay circuit configured to delay the signal transmitted from the second via, configured to generate a second delayed signal, and configured to transmit the second delayed signal to the second selector.

14. An integrated circuit package comprising:
a plurality of chips;
a plurality of vias configured to penetrate at least one of the plurality of chips, each of the plurality of vias being configured to provide a signal transmission route between the plurality of chips, the plurality of vias including a first via and a second via; and
a detour circuit configured to provide a detour route for the first via and the second via,
wherein the detour circuit includes,
a first buffer connected between an output terminal of the first via and a detour node, and configured to receive a signal transmitted from the first via;
a second buffer connected between an output terminal of the second via and the detour node, and configured to receive a signal transmitted from the second via;
a first detour circuit configured to receive a signal transmitted through the second buffer;
a second detour circuit configured to receive a signal transmitted through the first buffer, an output of the first buffer, an output of the second buffer, an input of the first detour circuit, and an input of the second detour circuit being connected with the detour node together;
a first selector configured to selectively output one of the signal transmitted from the first via and a signal transmitted through the first detour circuit, based on a state of signal transmission through the first via; and
a second selector configured to selectively output one of the signal transmitted from the second via and a signal transmitted through the second detour circuit, based on a state of signal transmission through the second via, and
wherein each of the first and second buffers and the first and second detour circuits is configured to transmit a signal in only one direction.

15. The integrated circuit package of claim 14, wherein when the signal transmission through the first via is disabled, the signal transmitted from the second via is provided to the first selector through the second buffer and the first detour circuit, and the first selector is configured to output the signal transmitted through the first detour circuit.

16. An integrated circuit comprising:
a first switch circuit connected between an output terminal of a first through-silicon via (TSV) and a detour node, and configured to receive a first signal transmitted from the first TSV;

a second switch circuit connected between an output terminal of a second TSV and the detour node, and configured to receive a second signal transmitted from the second TSV;

a third switch circuit configured to receive the second signal transmitted through the second switch circuit and the detour node;

a fourth switch circuit configured to receive the first signal transmitted through the first switch circuit and the detour node, an output of the first switch circuit, an output of the second switch circuit, an input of the third switch circuit, and an input of the fourth switch circuit being connected with the detour node together;

a first multiplexer configured to selectively output one of the first signal transmitted from the first TSV and the second signal transmitted through the third switch circuit, in response to a first determination associated with whether the first TSV is normal or disabled; and a second multiplexer configured to selectively output one of the second signal transmitted from the second TSV and the first signal transmitted through the fourth switch circuit, in response to a second determination associated with whether the second TSV is normal or disabled, wherein each of the first and fourth switch circuits is configured to transmit the first signal in only one direction, and each of the second and third switch circuits is configured to transmit the second signal in only one direction.

17. The integrated circuit of claim 16, wherein each of the first and second signals is a clock signal.

18. The integrated circuit of claim 16, wherein when the first TSV is disabled, the first multiplexer is configured to receive the second signal transmitted from the second TSV through a detour route which includes the second and third switch circuits, and configured to output the received second signal as an output signal.

19. The integrated circuit of claim 16, further comprising:

a first control logic circuit configured to perform the first determination associated with whether the first TSV is normal or disabled, and configured to control operations of the first and third switch circuits and the first multiplexer based on the first determination; and a second control logic circuit configured to perform the second determination associated with whether the second TSV is normal or disabled, and configured to control operations of the second and fourth switch circuits and the second multiplexer based on the second determination.

20. The integrated circuit of claim 19, wherein the first control logic circuit is configured to generate a first control signal and a first detour signal based on the first determination, a logic value of the first control signal being complementary to a logic value of the first detour signal, the second control logic circuit is configured to generate a second control signal and a second detour signal based on the second determination, a logic value of the second control signal being complementary to a logic value of the second detour signal, and wherein when the second TSV is disabled:

the first switch circuit is configured to be turned on in response to the first control signal, the third switch circuit is configured to be turned off in response to the first detour signal, and the first multiplexer is configured to receive and output the first signal transmitted from the first TSV in response to the first control signal, and the second switch circuit is configured to be turned off in response to the second control signal, the fourth switch circuit is configured to be turned on in response to the second detour signal, and the second multiplexer is configured to receive and output the first signal transmitted through a detour route in response to the second control signal, the detour route including the first and fourth switch circuits.

* * * * *